United States Patent
Kim et al.

(10) Patent No.: US 10,782,247 B2
(45) Date of Patent: Sep. 22, 2020

(54) APPARATUS AND METHOD FOR MEASURING PARTICLE ON SURFACE OF WAFER

(71) Applicant: SK SILTRON CO., LTD., Gumi-si Gyeongsangbuk-do (KR)

(72) Inventors: Kang San Kim, Gumi-si (KR); Jae Deog Lee, Gumi-si (KR)

(73) Assignee: SK SILTRON CO., LTD., Gyeongsangbuk-Do (KR)

(*) Notice: Subject to any disclaimer, the term of this patent is extended or adjusted under 35 U.S.C. 154(b) by 0 days.

(21) Appl. No.: 16/263,373

(22) Filed: Jan. 31, 2019

(65) Prior Publication Data

US 2020/0158660 A1    May 21, 2020

(30) Foreign Application Priority Data

Nov. 21, 2018 (KR) .................. 10-2018-0144584

(51) Int. Cl.
*G01N 21/95* (2006.01)
*H01L 21/67* (2006.01)
(Continued)

(52) U.S. Cl.
CPC ......... *G01N 21/9501* (2013.01); *G01N 21/47* (2013.01); *G01N 21/95607* (2013.01);
(Continued)

(58) Field of Classification Search
CPC .. G01N 21/9501; G01N 21/94; G01N 21/956; G01N 21/47; G01N 21/55; G01N 15/0205; G01N 2015/0238
(Continued)

(56) References Cited

U.S. PATENT DOCUMENTS

| 6,157,444 A * | 12/2000 | Tomita ............... G01N 21/9501 356/237.1 |
| 6,603,542 B1 * | 8/2003 | Chase ................ G01N 21/9501 257/E21.53 |

(Continued)

FOREIGN PATENT DOCUMENTS

| JP | 2002-519694 | 7/2002 |
| JP | 2016-502655 | 1/2016 |

(Continued)

OTHER PUBLICATIONS

Korean Notice of Allowance dated Jul. 24, 2020 issued in KR Application No. 10-2018-0144584.

*Primary Examiner* — Hoa Q Pham
(74) *Attorney, Agent, or Firm* — KED & Associates, LLP (57) ABSTRACT

An embodiment provides a method for measuring particles on a wafer surface, the method including: disposing and rotating a wafer on a stage; irradiating a laser in a first region of a center of a surface of the rotating wafer, a second region between the first region and a third region, and the third region at an edge thereof; and measuring a laser reflected from the first to third regions of the wafer, wherein a second output of the laser irradiated in the second region is larger than a first output of the laser irradiated in the first region and a third output of the laser irradiated in the third region is larger than the second output of the laser irradiated in the second region.

20 Claims, 4 Drawing Sheets

(51) Int. Cl.
    *G01N 21/956*     (2006.01)
    *G01N 21/47*     (2006.01)
    *H01L 21/687*     (2006.01)

(52) U.S. Cl.
    CPC .. *H01L 21/67288* (2013.01); *H01L 21/68764* (2013.01); *G01N 2021/4735* (2013.01)

(58) Field of Classification Search
    USPC .................................. 356/237.1–237.5, 338
    See application file for complete search history.

(56) References Cited

U.S. PATENT DOCUMENTS

| | | | | |
|---|---|---|---|---|
| 7,123,357 | B2* | 10/2006 | Meeks | G01B 11/0616 |
| | | | | 356/237.3 |
| 2002/0054704 | A1 | 5/2002 | Smilansky et al. | |
| 2006/0124874 | A1* | 6/2006 | Uto | G01N 21/9501 |
| | | | | 250/559.45 |
| 2007/0259290 | A1* | 11/2007 | Okita | G01N 21/956 |
| | | | | 430/312 |
| 2014/0154891 | A1* | 6/2014 | Donaldson | H01L 21/268 |
| | | | | 438/795 |

FOREIGN PATENT DOCUMENTS

| | | |
|---|---|---|
| KR | 10-2004-0088139 | 10/2004 |
| KR | 10-2014-0061452 | 5/2014 |

* cited by examiner

APPARATUS AND METHOD FOR MEASURING PARTICLE ON SURFACE OF WAFER

CROSS-REFERENCE TO RELATED APPLICATIONS

This application claims under 35 U.S.C. § 119 to Korean Patent Application No. 10-2018-0144584, filed in Korea on Nov. 21, 2018, which is hereby incorporated by reference.

TECHNICAL FIELD

Embodiments relate to an apparatus and a method for measuring particles on a wafer surface, and in particular, to an apparatus and a method for measuring particles on a wafer surface capable of measuring fine particles having a size of several micrometers (μm) or less located on a wafer surface.

BACKGROUND

A silicon wafer, which is used as a material for producing an electronic component such as a semiconductor or a solar cell is fabricated through a series of processes after a silicon single crystal ingot is grown by a Czochralski (CZ) method or the like. In addition, a semiconductor is fabricated through a process such as implanting a predetermined ion and forming a circuit pattern in a wafer.

An integration density of a semiconductor device has increased, and a number and size of particles allowed on a wafer are more strictly limited. In the related art, fine defects or particles such as scratches on a wafer surface have been measured by visual inspection, an optical microscope, a particle counter or the like.

However, since a visual inspection method uses a halogen lamp having a wide wavelength band as a light source, it is not possible to observe particles of nanometer size. In addition, a method of measuring with an optical microscope is difficult to measure and not only requires a long time but also reproducibility is lowered when confirming a position of defects because an area that may be measured at once is reduced according to increasing of a magnification.

In addition, in a method of using a particle counter device, a presence and position of particles are measured by detecting a laser reflected after irradiating laser on a wafer surface.

However, the above-described particle counter device has following problems.

Figure 1:
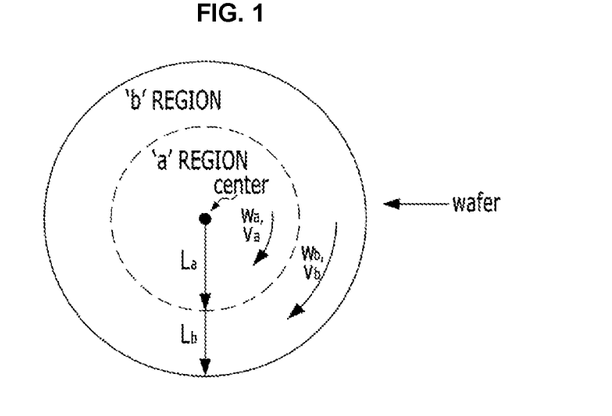
FIG. 1 is a view showing a principle of a particle counter device of the related art.

When a wafer is disposed on a stage and the stage is rotated, the wafer is rotated at a predetermined angular velocity. At this time, when an inside of a wafer surface in FIG. 1 is referred to as an 'a' region and an outside thereof is referred to as a 'b' region, a wafer in the 'a' region has an angular velocity of $W_a$ and a linear velocity of $V_a$, a wafer in the 'b' region has angular velocity of $W_b$ and a linear velocity of $V_b$, and a laser may be irradiated on the wafer surface while moving in the directions of $L_a$ and $L_b$ in the 'a' region and the 'b' region, respectively.

At this time, since the above-described angular velocities $W_a$ and $W_b$ are the same each other but the linear velocities $V_a$ and $V_b$ are different from each other, a rotational angular velocity $V_b$ of the wafer in the 'b' region is more lager than a rotational angular velocity $V_a$ of the wafer in the 'a' region. Accordingly, when the laser moving in the $L_a$ and $L_b$ directions in the 'a' region and the 'b' region moves at the same speed, a time when the 'b' region is exposed to the laser may be shorter than a time when the 'a' region of the wafer surface is exposed to the laser.

Therefore, when one wafer is rotated and a laser is irradiated on the wafer surface, a time when the laser is irradiated to an outer region is shortened than that of an inner region, and thus, detection of particles in the outer region may be more difficult.

SUMMARY

Embodiments are directed to providing an apparatus and a method for measuring particles on a wafer surface capable of detecting particles or defects evenly in the entire region of a wafer surface.

An embodiment provides a method for measuring particles on a wafer surface, the method including: disposing and rotating a wafer on a stage; irradiating a laser in a first region of a center of a surface of the rotating wafer, a second region between the first region and a third region, and the third region of an edge thereof; and measuring a laser reflected from the first to third regions of the wafer, wherein a second output of the laser irradiated in the second region is larger than a first output of the laser irradiated in the first region and a third output of the laser irradiated in the third region is larger than the second output of the laser irradiated in the second region.

The first output and the third output may be constant and the second output may increase as it becomes farther from the center of the wafer surface.

The first region may be located in a region of $1/14$ to $1/16$ of a radius from the center of the wafer.

The first output of the laser may be 40% to 60% of the third output of the laser.

The second region may be located in a region from $1/14$ to $1/16$ to $2/9$ to $4/9$ of the radius from the center of the wafer.

The second output of the laser may increase from 40% to 60% to 100% of the third output of the laser.

The third region may be located from a region of $2/9$ to $4/9$ of the radius from the center of the wafer to the edge of the wafer.

The laser may move linearly in an edge direction from the center of the wafer surface, and may be irradiated onto the wafer surface.

The laser may move linearly in a center direction from the edge direction of the wafer surface, and may be irradiated onto the wafer surface.

The laser may include a first laser having the first output, a second laser having the second output, and a third laser having the third output, wherein the first laser to the third laser may be irradiated simultaneously in the first to third regions.

Another embodiment provides an apparatus for measuring particles on a wafer surface, the apparatus including: a stage on which a wafer is disposed; a first driving unit for rotating the stage; a laser generator for irradiating a laser onto a surface of a rotating wafer on the stage; a controller for adjusting an output of a laser emitted from the laser generator; and a laser detector for detecting a laser reflected or scattered from particles on the wafer surface, wherein the surface of the rotating wafer is divided into a first region of a center thereof, a second region between the first region and a third region, and the third region of an edge thereof, and the controller adjusts the output of the laser emitted from the laser generator such that a second output of the laser irradiated in the second region is larger than a first output of the laser irradiated in the first region and a third output of the laser irradiated in the third region is larger than the second output of the laser irradiated in the second region.

The controller may adjust the output of the laser such that the first output and the third output are constant and the second output increases as it becomes farther from the center of the wafer surface.

The apparatus for measuring particles on the wafer surface may further include a second driving unit for linearly moving the laser generator such that the laser is irradiated in an edge direction from the center of the wafer surface mounted on the stage.

The apparatus for measuring particles on the wafer surface may further include a second driving unit for linearly moving the laser generator such that the laser moves linearly in a center direction from the edge direction of the wafer surface.

The laser generator may include a first laser generator having the first output, a second laser generator having the second output, and a third laser generator having the third output, wherein the first to third laser generators may irradiate simultaneously a laser in the first region to the third region.

DETAILED DESCRIPTION OF THE EMBODIMENTS

Hereinafter, embodiments are provided in order to explain the invention in detail, and will be described in detail with reference to accompanying drawings to help understanding of the invention.

However, embodiments according to the present invention may be modified into various other forms, and the scope of the present invention should not be construed as being limited to the embodiments set forth herein. Embodiments of the present invention are provided to more fully explain the present invention to those skilled in the art.

In addition, relational terms such as 'first' and 'second,' upper and 'lower,' and the like, without necessarily requiring or implying any physical or logical relationship or order between its entities or elements, may only be used to distinguish one entity or element from another entity or element.

An apparatus and a method for measuring particles on a wafer surface according to an embodiment may particularly be used for measuring particles on a silicon wafer surface. In addition, a silicon wafer may be fabricated through a grinding process for machining an outer circumferential surface of a silicon single crystal ingot grown by the CZ method or the like, a slicing process for thinly slicing a single crystal silicon ingot into a wafer shape, a lapping process for improving flatness while polishing to a desired wafer thickness, an etching process for removing a damaged layer inside a wafer, a polishing process for improving mirroring and flatness on a wafer surface, a cleaning process to be described later for removing contaminants on a wafer surface, an oxide film forming process and a rapid thermal process, and the like.

Figure 2:
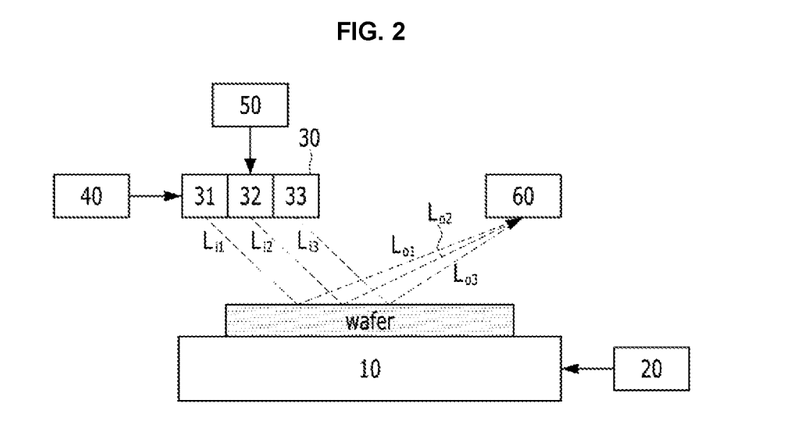
FIG. 2 is a view showing an apparatus for measuring particles on a wafer surface according to an embodiment.

FIG. 2 is a view showing an apparatus for measuring particles on a wafer surface according to an embodiment.

The apparatus for measuring particles according to the embodiment includes a stage 10 on which a wafer is disposed, a first driving unit 20 for driving the stage 10, a laser generator 30 which may include laser generators 31-33 for irradiating a lasers $L_{i1}$, $L_{i2}$, $L_{i3}$ onto a surface of a rotating wafer on the stage 10, a second driving unit 40 for driving the laser generator 30, a controller 50 for adjusting an output of a laser emitted from the laser generator 30, and a laser detector 60 for detecting a lasers $L_{o1}$, $L_{o2}$, $L_{o3}$ reflected or scattered from particles on the wafer surface.

Figure 3:
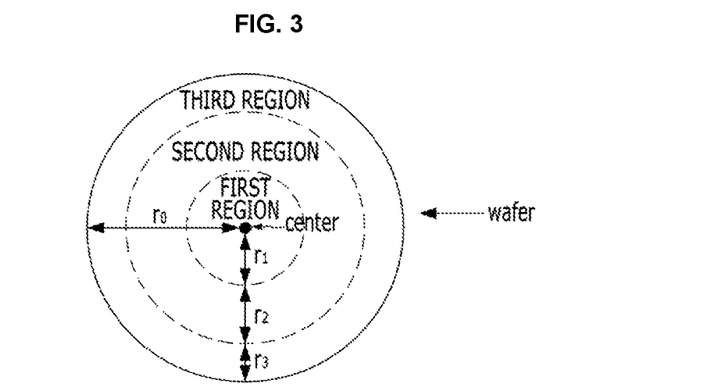
FIG. 3 is a view showing a first region to a third region of a wafer on a stage of FIG. 2.

FIG. 3 is a view showing a first region to a third region of the wafer on the stage of FIG. 2. In order to detect particles or the like, a wafer surface is divided into a first region to a third region according to a distance from a center such that a power of a laser irradiated in each region of the wafer is different, but the first region to the third region do not have different physical characteristics.

The wafer may be in a disc shape having a predetermined thickness, and a plane of the wafer is shown in FIG. 3. A region within a predetermined radius from the center of the wafer may be referred to as a first region, a region of an edge of the wafer may be referred to as a third region, and a region between the first region and the third region may be referred to as a second region.

When a radius of the wafer is '$r_0$', a radius of the first region of the wafer may be '$r_1$', a width of the second region of the wafer may be '$r_2$', and a width of the third region of the wafer may be '$r_3$'.

Specifically, the first region may be located in a region of 1/14 to 1/16 of the radius '$r_0$' from the center of the wafer. That is, when the radius '$r_0$' of the wafer is 150 millimeters, the radius '$r_1$' of the first region of the wafer may be 1/14 to 1/16 of the radius '$r_0$' of the wafer, as an example, may be 10 millimeters.

In addition, the second region may be located surrounding the first region, and in detail, may be located in a region from 1/14 to 1/16 to 2/5 to 4/5 of the radius '$r_0$' of the wafer. That is, when the radius '$r_0$' of the wafer is 150 millimeters, the second region of the wafer may be located in a region of 2/5 to 4/5 of the radius '$r_0$' from a circumference of the first region as described above, and the '$r_2$' may be 45 millimeters in FIG. 3, as an example.

In addition, the third region may be located surrounding the second region, and may be located from 2/5 to 4/5 of the radius '$r_0$' of the wafer to the edge of the wafer. That is, when the radius '$r_0$' of the wafer is 150 millimeters, the third region of the wafer may refer to an outer region of the second region as described above, and the '$r_3$' may be 148 millimeters in FIG. 3, as an example. Here, when the radius '$r_0$' of the wafer is 150 millimeters, a region having a width of about 2 millimeters at the outermost side of the wafer is not flat, but has a rounded inclination, so that it may be difficult to detect particles by irradiating the laser, and the region may be excluded from the third region.

Figure 4A:
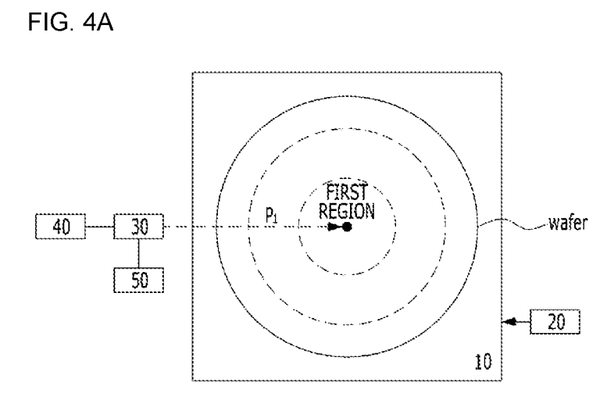
FIGS. 4A to 4C are views showing that a laser is irradiated in a first region to a third region of a wafer.
Figure 4B:
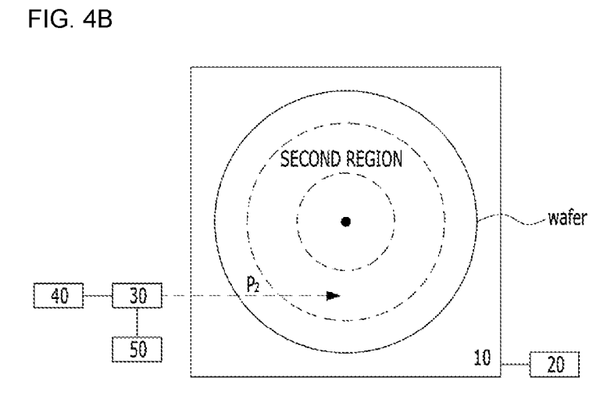
Figure 4C:
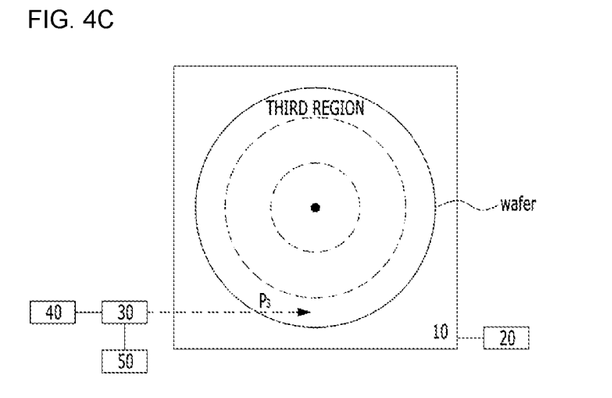

FIGS. 4A to 4C are views showing that a laser is irradiated in a first region to a third region of a wafer. In an apparatus and a method for measuring particles on a wafer surface according to an embodiment, a laser is irradiated on a wafer surface while rotating one wafer on the stage 10. At this time, the wafer rotates with a predetermined angular velocity, and a linear velocity in an edge region is larger than a linear velocity in a region close to a center on the wafer surface, so that a frequency of laser irradiation for a unit time in a predetermined area in the edge region of the wafer surface may be smaller than that of laser irradiation for the same unit time in the same predetermined area in the region close to the center thereof. Therefore, it may be easy to detect particles and the like even in the edge region of the wafer surface by increasing an output of the laser irradiated in the edge region of the wafer surface.

In FIG. 4A, the stage 10 may be rotated by the first driving unit 20, and at this time, a wafer on the stage 10 may also be rotated, and a laser may be irradiated in a first region of a wafer surface by the laser generator 30. At this time, an output of the laser may be referred to as a first output $P_1$.

In FIG. 4B, a laser may be irradiated in a second region of the wafer surface by the laser generator 30, and at this time, an output of the laser may be referred to as a second output $P_2$, and in FIG. 4C, a laser may be irradiated in a third region of the wafer surface by the laser generator 30 and at this time, an output of the laser may be referred to as a third output $P_3$.

Here, the first output $P_1$ is constant, and the third output $P_3$ is constant but may be larger than the first output $P_1$. In addition, the second output $P_2$ may increase from the first output $P_1$ to the third output $P_3$. Specifically, as a point at which the laser is irradiated is away from the center of the wafer, the second output $P_2$ may be increased.

The first output $P_1$ of the laser irradiated in the first region may be 40% to 60% of the third output $P_3$ of the laser irradiated in the third region, and may be 50%, as an example. In addition, the second output $P_2$ of the laser irradiated in the second region may increase from 40% to 60% to 100% of the third output $P_3$ of the laser. That is, the second output $P_2$ of the laser in the second region adjacent to the first region may be 40% to 60% of the third output $P_3$ of the laser, and may gradually increase so that the second output $P_2$ of the laser in the second region adjacent to the third region may reach 100% of the third output $P_3$.

In addition, the laser may be generated in a range of 70% or less of a designed maximum output for the durability of the laser generator 30. At this time, the first output $P_1$ of the laser irradiated in the first region may be 28% to 42% of the designed maximum output, and may be 35%, as an example. Further, the third output $P_3$ of the laser irradiated in the third region may be 70% of the designed maximum output. Furthermore, the second output $P_2$ of the laser irradiated in the second region may increase from 28% to 42% to 70% of the designed maximum output of the laser. That is, the second output $P_2$ of the laser in the second region adjacent to the first region may be between 28% and 42% of the designed maximum output of the laser, and may gradually increase so that the second output $P_2$ of the laser in the second region adjacent to the third region may reach 70% of the designed maximum output.

In FIGS. 4A to 4C, the wafer on the stage 10 is rotated by actions of the first driving unit 20, and the laser generator 30 is moved by actions of the second driving unit 40, and the laser emitted from the laser generator 30 may reach the third region through the second region from the first region in which the laser reaches the wafer. At this time, the second driving unit 40 may move linearly the laser generator 30 such that an emitted laser is irradiated in an edge direction from the center of the wafer surface mounted on the stage 10. In addition, even if the laser generator 30 moves linearly, the wafer rotates, so that the laser may be irradiated evenly in the entire region of the wafer.

In addition, at this time, the controller 50 may adjust the output of the laser depending on the region in which the laser reaches such that the second output of the laser irradiated in the second region is larger than the first output of the laser irradiated in the first region and the third output of the laser irradiated in the third region is larger than the second output of the laser irradiated in the second region. Specifically, as described above, the output of the laser emitted from the laser generator 30 may be adjusted as described above.

In addition, the laser detector 60 may detect a laser reflected or scattered from defects such as particles on the wafer surface. That is, when particles are present on the wafer surface, or when a jut in an irregularly protruding shape is formed, when an embossing in a constantly protruding shape is formed, when a scratch is formed, when an irregularly recessed pit is formed, when crowded pits are formed, when a dimple in a constantly recessed shape is formed, when a jut-pit is formed, and when a sweep is formed, since an emission angle of the laser reflected or scattered on the wafer surface is changed irregularly, it is possible to confirm defects such as the above-described particles by detecting this with the laser detector 60. Therefore, the apparatus and method for detecting particles on a wafer surface according to the embodiment may detect the above-described other defects in the same way.

Figure 5A:
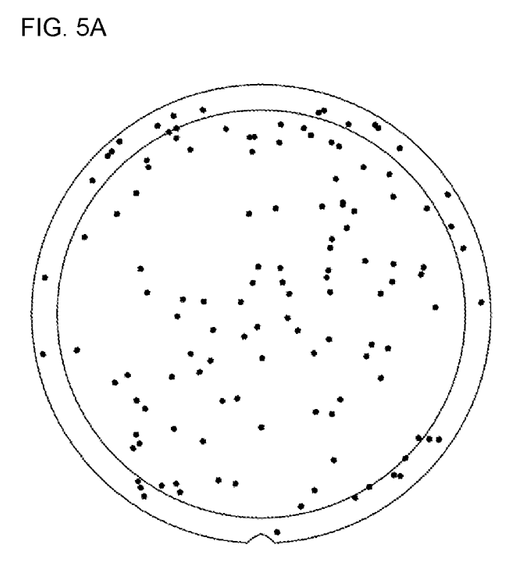
FIGS. 5A and 5B are views showing results of measuring particles on a wafer surface according to a comparative example and an embodiment.
Figure 5B:
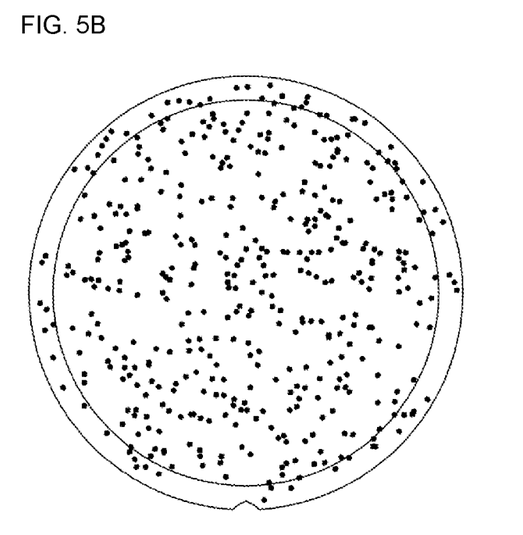

FIG. 5 is view showing results of measuring particles on a wafer surface according to a comparative example and an embodiment.

A comparative example of FIG. 5A shows results of measuring particles or other defects by irradiating a laser of the same output in an entire region of the wafer, and an embodiment of FIG. 5B shows results of measuring particles on the wafer surface by the above-described apparatus and method. A region having a width of about 2 millimeters at an edge of the wafer is a region in which defects such as particles are not well detected by a laser.

In the embodiment, many particles and defects on the wafer surface are detected as compared with the comparative example, which may be due to an increase in the output of the laser irradiated in the edge region of the wafer rather than an actual increase in the number of particles or defects.

Figure 6:
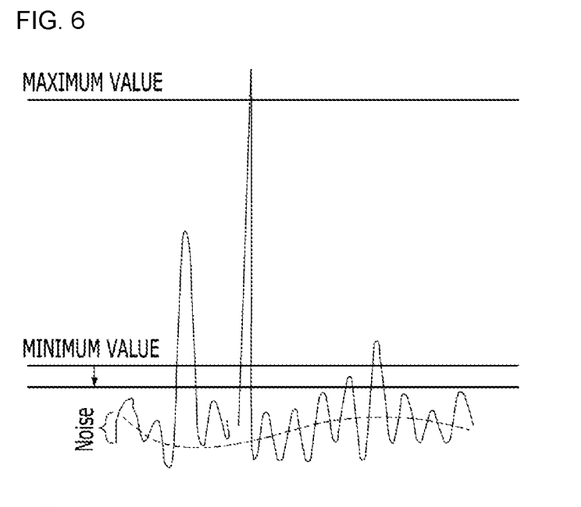
FIGS. 6 and 7 are views showing effects of an apparatus and a method for measuring particles on a wafer surface according to an embodiment.

As shown in FIG. 6, when a reflected or scattered laser is detected after irradiating a laser on a wafer surface, a laser detected at a minimum value (Min. value) or less is processed as noise, not a valid value, and a laser detected at a maximum value (Max. value) or more is processed as an invalid value by estimating that it is caused by other causes, not particles or other defects. Accordingly, a peak between the maximum value and the minimum value is measured by the number of effective particles or the like, and two peaks are measured as valid values in the related art, but in the embodiment, a greater number of particles or defects may be detected by adjusting an output of the laser irradiated according to the region of the wafer surface. As a result, three particles or defects may be detected by lowering the minimum value as indicated by an arrow.

Figure 7:
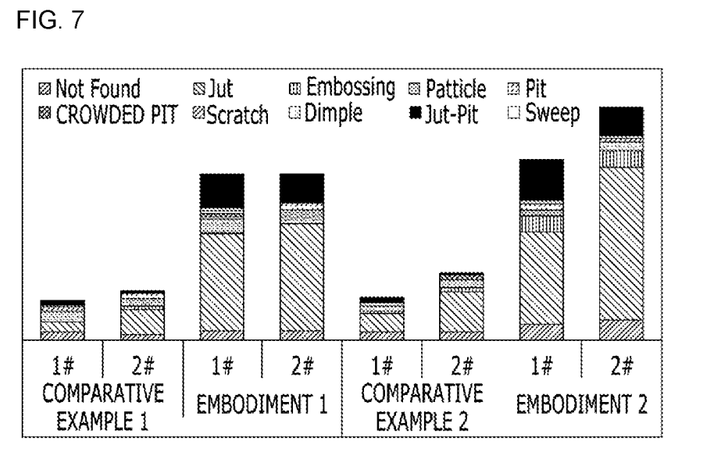

In a comparative example 1 and an embodiment 1 of FIG. 7, the same wafer sample is prepared, and apparatuses and methods according to a comparative example and an embodiment are used twice, respectively to detect particles and the like on the wafer surface, and in a comparative example 2 and an embodiment 2 of FIG. 7, apparatuses and methods according to a comparative example and an embodiment are used twice, respectively after preparing wafer samples which are different from the wafers of the comparative example 1 and the embodiment 1 to detect particles and the like on the wafer surface.

In the embodiment, the number of particles, juts, embossings, scratches, pits, crowded pits, dimples, jut-pits, sweeps, and the like were more detected than in the comparative example by adjusting the output of the laser irradiated according to the region of the wafer surface. In the case of particles, particles having a diameter of about 19 nanometers may be measured in the relater art, but it is possible to measure particles having a diameter of 16 to 17 nanometers in the embodiment.

An apparatus and a method for measuring particles on a wafer surface according to an embodiment, uses one laser generator, moves the laser generator, and relatively increases an output of a laser irradiated in an outer region of a wafer surface, thereby increasing the number of particles to be detected or measured.

In addition, in the embodiment, the laser generator moves linearly in an edge direction from a center of the wafer surface, but the laser may be irradiated onto the wafer surface while the laser generator moves linearly in a center direction from the edge direction of the wafer surface.

In an apparatus and a method for measuring particles on a wafer surface according to another embodiment, a plurality of laser generators are used, and at this time, different laser generators are located in a first region, a second region and a third region of a wafer, and a first laser generator located in the first region irradiates a laser of a first output, a second laser generator located in the second region irradiates a laser of a second output, and a third laser generator located in the third region irradiates a laser of a third output. At this time, the first to third outputs are controlled so as to have the same output ratios as those of the above-described embodiment, so that an output of a laser irradiated in an outer region of a wafer surface is relatively increased, thereby increasing the number of particles to be detected or measured.

At this time, the first to third laser generators may irradiate lasers having different outputs in the first to third regions of the wafer at the same time or at different times.

In an apparatus and a method for measuring particles on a wafer surface according to still another embodiment, while a laser of the same output is irradiated, a moving speed of a laser generator in an outer region of a wafer surface may be reduced, so that it is possible to increase a frequency or time at which the laser is irradiated in the outer region of the wafer surface.

An apparatus and a method for measuring particles on a wafer surface according to an embodiment, uses one laser generator, moves the laser generator, and relatively increases an output of a laser irradiated in an outer region of a wafer surface, thereby increasing the number of particles to be detected or measured.

In addition, a plurality of laser generators are used, and the number of particles or the like to be detected or measured is increased by irradiating a laser having a relatively large output by a laser generator corresponding to an edge region of the wafer surface.

In addition, while a laser of the same output is irradiated, a moving speed of a laser generator in an outer region of the wafer surface may be reduced, so that it is possible to increase a frequency or time at which the laser is irradiated in the outer region of the wafer surface.

As described above, the embodiments have been described by limited embodiments and drawings, but the present invention is not limited to the embodiments, and various modifications and changes may be made therefrom by those skilled in the art to which the present invention belongs.

Therefore, the scope of the present invention should not be limited to the described embodiments, but should be defined by equivalents to the scope of the claims as well as the claims which will be described later.

What is claimed is:

1. A method for measuring particles on a wafer surface, the method comprising:
    disposing and rotating a wafer on a stage;
    irradiating at least one laser in a first region including a center of the wafer surface of the rotating wafer, a second region between the first region and a third region of the wafer surface, and the third region including an edge thereof; and
    measuring a laser reflected from the first to third regions of the wafer surface,
    wherein a second output of the laser irradiated in the second region is larger than a first output of the laser irradiated in the first region, and a third output of the laser irradiated in the third region is larger than the second output of the laser irradiated in the second region, and
    wherein the first output and the third output are constant, and the second output increases farther from the center of the wafer surface.

2. The method of claim 1, wherein an outer boundary of the first region is located from $1/14$ of a radius to $1/16$ of the radius from the center of the wafer surface.

3. The method of claim 2, wherein an inner boundary of the second region corresponds to the outer boundary of the first region, and an outer boundary of the second region is located from $2/9$ of the radius to $4/9$ of the radius from the center of the wafer surface.

4. The method of claim 1, wherein the first output of the laser is 40% to 60% of the third output of the laser.

5. The method of claim 1, wherein the second output of the laser increases from 40% to 60% of the third output to 100% of the third output of the laser.

6. The method of claim 1, wherein the third region is located from a region between $2/9$ to $4/9$ of a radius from the center of the wafer surface to the edge of the wafer surface.

7. The method of claim 1, wherein the at least one laser includes a first laser having the first output, a second laser having the second output, and a third laser having the third output, and
    wherein the first laser to the third laser are irradiated simultaneously in the first to third regions.

8. The method of claim 1, wherein the laser irradiated in the first, second, and third regions is formed by a laser generator, and
    wherein irradiating the laser includes:
        moving the laser generator to irradiate the laser, respectively, in the first, second, and third regions, and
        controlling the laser generator to vary the laser in the first, second, and third regions as the laser generator is moved.

9. A method for measuring particles on a wafer surface of a wafer, the method comprising:
    positioning and rotating the wafer on a stage;
    irradiating a laser in a first region, a second region, and a third region of the wafer surface, the first region including a center of the wafer surface, the third region including an outer edge of the wafer surface, and the second region being positioned between the first region and the third region; and measuring a laser reflected from the first to third regions of the wafer, wherein a second output of the laser irradiated in the second region is greater than a first output of the laser irradiated in the first region, and a third output of the laser irradiated in the third region is greater than the second output of the laser irradiated in the second region, and wherein the second output of the laser increases from 40% to 60% the third output of the laser to 100% of the third output of the laser.

10. The method of claim 9, wherein the first output is 40% to 60% of the third output.

11. The method of claim 9, wherein an outer boundary of the first region is located from 1/14 of a radius to 1/16 of the radius from the center of the wafer surface.

12. The method of claim 11, wherein an inner boundary of the second region corresponds to the outer boundary of the first region, and an outer boundary of the second region is located from 2/9 of a radius to 4/9 of the radius from the center of the wafer surface.

13. The method of claim 9, wherein the third region is located from a region of 2/9 to 4/9 of a radius from the center of the wafer surface to the edge of the wafer surface.

14. The method of claim 9, wherein the laser irradiated in the first, second, and third regions is formed by a laser generator, and wherein irradiating the laser includes:
moving the laser generator to irradiate the laser, respectively, in the first, second, and third regions, and
controlling the laser generator to vary the laser as the laser generator is moved.

15. A method for measuring particles on a wafer surface of a wafer, the method comprising:

rotating the wafer on a stage;

irradiating at least one laser in a first region, a second region, and a third region of the wafer surface, the first region including a center of the wafer surface, the second region being positioned between the first region and the third region, and the third region including an outer edge of the wafer surface; and measuring at least one laser reflected from the first to third regions of the wafer surface, wherein a second output of the laser irradiated in the second region is greater than a first output of the laser irradiated in the first region, and a third output of the laser irradiated in the third region is greater than the second output of the laser irradiated in the second region, wherein the at least one laser irradiated to the wafer surface includes a first laser having the first output, a second laser having the second output, and a third laser having the third output, and wherein the first laser, the second laser, and the third laser are irradiated simultaneously in the first to third regions.

16. The method of claim 15, wherein the first output is 40% to 60% of the third output.

17. The method of claim 15, wherein an outer boundary of the first region is located from 1/14 of a radius to 1/16 of the radius from the center of the wafer surface.

18. The method of claim 17, wherein an inner boundary of the second region corresponds to the outer boundary of the first region, and an outer boundary of the second region is located from 2/9 of the radius to 4/9 of the radius from the center of the wafer surface.

19. The method of claim 15, wherein the second output increases from a first value of 40% to 60% of the third output to a second value of 100% of the third output.

20. The method of claim 15, wherein the third region is located from a region of 2/9 to 4/9 of a radius from the center of the wafer surface to the edge of the wafer surface.

* * * * *